US012618150B2

(12) United States Patent
Delehouze et al.

(10) Patent No.: US 12,618,150 B2
(45) Date of Patent: May 5, 2026

(54) DEVICE FOR CHEMICAL VAPOUR DEPOSITION

(71) Applicant: SAFRAN CERAMICS, Le Haillan (FR)

(72) Inventors: Arnaud Delehouze, Moissy-Cramayel (FR); Rémi Pierre Robert Bouvier, Moissy-Cramayel (FR); Manon Fernandez, Moissy-Cramayel (FR)

(73) Assignee: SAFRAN CERAMICS, Le Haillan (FR)

( * ) Notice: Subject to any disclaimer, the term of this patent is extended or adjusted under 35 U.S.C. 154(b) by 58 days.

(21) Appl. No.: 18/684,972

(22) PCT Filed: Aug. 10, 2022

(86) PCT No.: PCT/FR2022/051574

§ 371 (c)(1),
(2) Date: Feb. 20, 2024

(87) PCT Pub. No.: WO2023/021256

PCT Pub. Date: Feb. 23, 2023

(65) Prior Publication Data

US 2024/0368757 A1 Nov. 7, 2024

(30) Foreign Application Priority Data

Aug. 20, 2021 (FR) ...................................... 2108807

(51) Int. Cl.
*C23C 16/442* (2006.01)
*C23C 16/34* (2006.01)
*C23C 16/44* (2006.01)

(52) U.S. Cl.
CPC .......... *C23C 16/442* (2013.01); *C23C 16/342* (2013.01); *C23C 16/4417* (2013.01)

(58) Field of Classification Search
CPC .. C23C 16/4417; C23C 16/342; C23C 16/442
See application file for complete search history.

(56) References Cited

U.S. PATENT DOCUMENTS 4,259,925 A 4/1981 Bernert et al.
5,672,382 A 9/1997 Lux
(Continued)

FOREIGN PATENT DOCUMENTS

EP 0 832 312 A2 4/1998
EP 0 979 316 A1 2/2000
(Continued)

OTHER PUBLICATIONS

International Search Report as issued in International Patent Application No. PCT/FR2022/051574, dated Dec. 13, 2022.

*Primary Examiner* — Kelly M Gambetta
(74) *Attorney, Agent, or Firm* — CUSHMAN PARTNERS, LLC

(57) ABSTRACT

A device for fluidised bed chemical vapour deposition, includes a reactor including a treatment zone in which the fluidised bed chemical vapour deposition is intended to be carried out using at least a first and a second reactive gas and a diffuser under the treatment zone delimiting the reactor, and a heating system configured to heat at least the treatment zone. The device includes a first channel for introducing the first reactive gas and a second channel for introducing the second reactive gas, which second channel is separate from the first channel and opens out under the diffuser, and wherein the first introduction channel is capable of being moved with respect to the heating system.

4 Claims, 3 Drawing Sheets

(56) References Cited

U.S. PATENT DOCUMENTS 5,855,678 A * 1/1999 Sanjurjo ............... C23C 16/442
                                                        118/724
7,651,668 B2 1/2010 Nakayama et al.

FOREIGN PATENT DOCUMENTS

WO        WO 96/41036 A2    12/1996
WO        WO 98/49366 A1    11/1998

* cited by examiner

[Fig. 1]
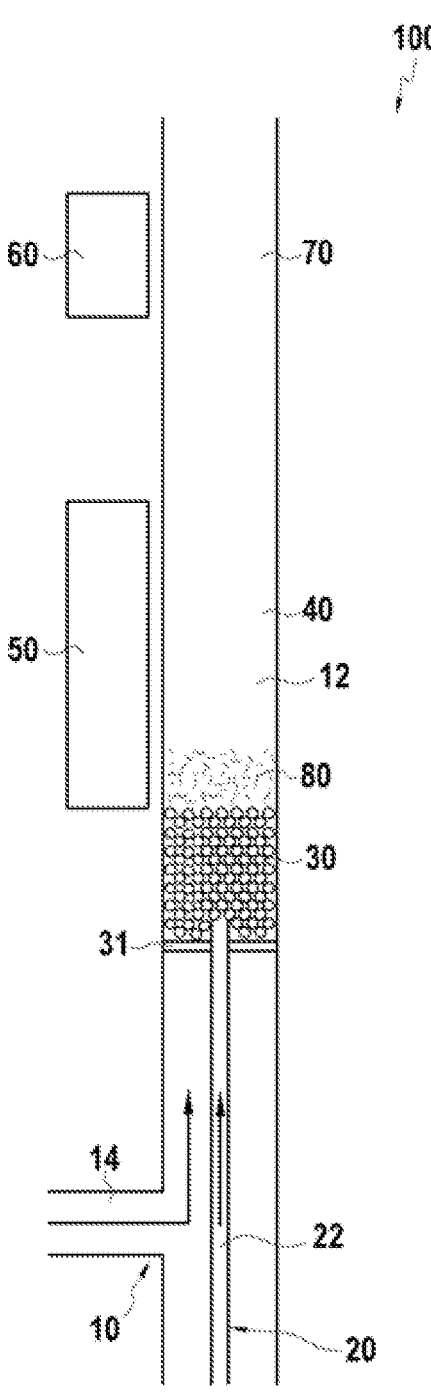

[Fig. 2]
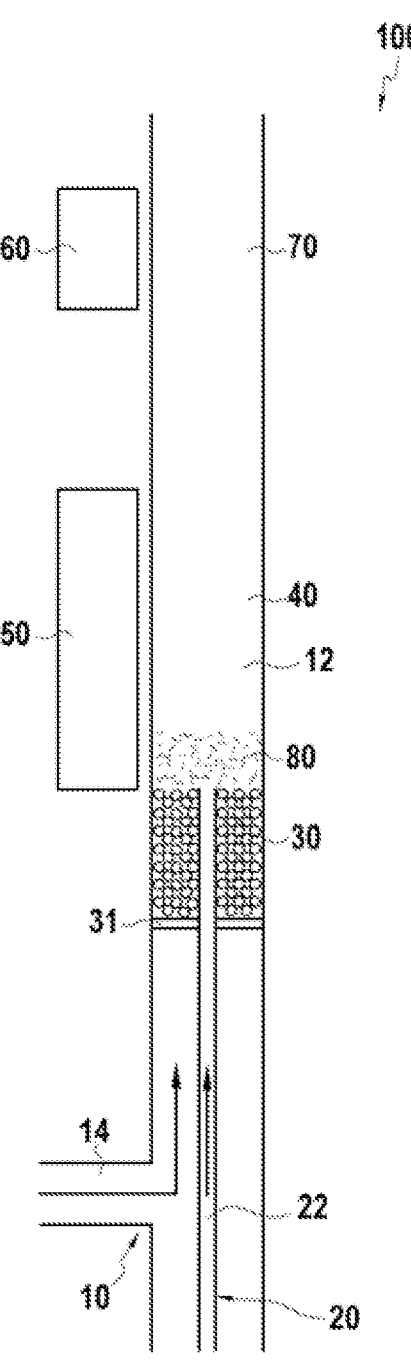

[Fig. 3]
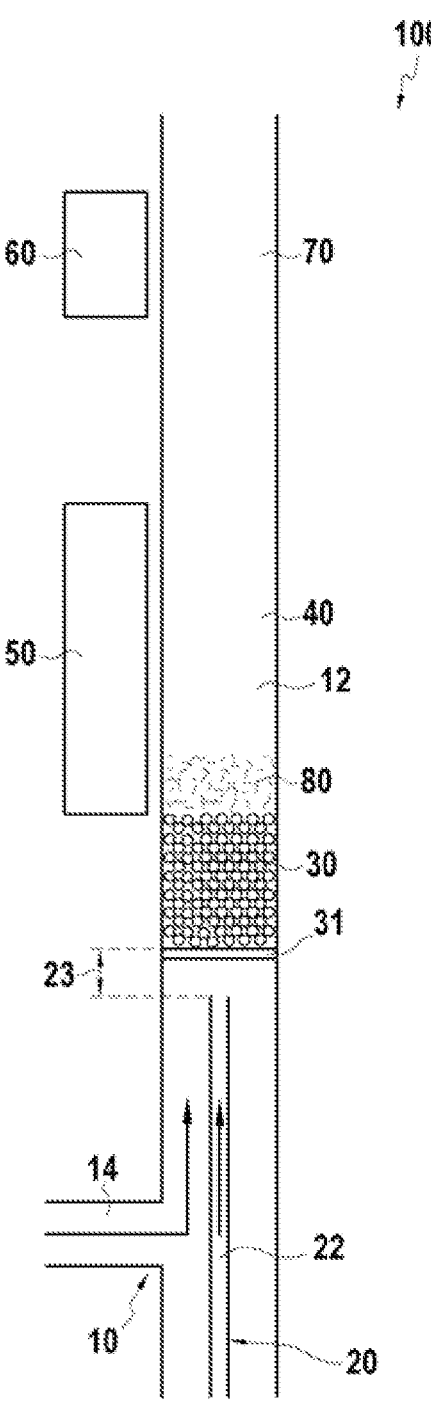

DEVICE FOR CHEMICAL VAPOUR DEPOSITION

CROSS-REFERENCE TO RELATED APPLICATIONS

This application is the U.S. National Stage of PCT/FR2022/051574, filed Aug. 10, 2022, which in turn claims priority to French patent application number 21 08807 filed Aug. 20, 2021. The content of these applications are incorporated herein by reference in their entireties.

TECHNICAL FIELD

The present invention relates to the field of ceramic matrix composite materials, and more particularly to the field of coatings for reinforcement particles made of such materials and the methods for obtaining same.

PRIOR ART

Ceramic matrix composite materials (CMC materials) have good thermostructural properties, in other words high mechanical properties which make them suitable for forming structural parts, and the ability to retain these properties at high-temperatures. CMC parts may comprise a textile reinforcement formed of long continuous fibres woven in the stress directions of the final composite part. The weaving step is an expensive step and the use of a woven fibrous reinforcement may present limitations in the case of parts with complex geometry or small size. Indeed, the minimum weaving pitch may prove too coarse for producing a small geometric detail.

In order to solve this problem, it has been envisaged to use a reinforcement that is no longer formed of long continuous fibres, but of particles of smaller dimensions dispersed in the matrix. However, it is well-known that the function of a CMC material requires specific management of the interfacial bonds between reinforcement and matrix, in order to obtain the hard to damage nature of the final composite. This modulation of the interfaces is conventionally obtained by positioning an interphase between the reinforcement and the matrix.

Conventionally, reinforcements consisting of particles with small dimensions, and coated with an interphase are obtained by cutting long fibres that are themselves coated. It is however observed, on the one hand, that the cutting cross-sections are not coated and, on the other hand, that the cutting step damages the coating which may degrade its properties.

It is therefore desirable to have a device that can directly coat particles intended to form the reinforcement of the ceramic matrix composite material.

DISCLOSURE OF THE INVENTION

For this purpose, the inventors are proposing a device for fluidised bed chemical vapour deposition, comprising:
- a reactor comprising a treatment zone in which the fluidised bed chemical vapour deposition is intended to be carried out using at least a first and a second reactive gas and a diffuser under the treatment zone delimiting the reactor,
- and a heating system configured to heat at least the treatment zone,
- the device being characterised in that it comprises a first channel for introducing the first reactive gas and a second channel for introducing the second reactive gas, which second channel is separate from the first channel and opens out under the diffuser, and in that the first introduction channel is capable of being moved with respect to the heating system.

The inventors have observed that a device such as described above can best control the conditions under which the mixture of two reactive gases takes place. In particular, the mobility of the first introduction channel with respect to the heating system can ensure that the mixture of first and second reactive gases takes place at an optimum gas-mixture temperature.

The optimum gas mixture temperature is understood as the temperature at which it is advantageous to carry out the mixing of said reactive gases. For example, this may avoid any loss of reagent due to the formation of undesired products, or improve the mixing conditions of the reactive gases. It should be noted that reaction of the reactive gases with one another once mixed at the optimum mixing temperature is not excluded, provided that such reactions are beneficial for the subsequent formation of the desired deposit.

In certain cases, the optimum mixing temperature can correspond to the reaction temperature at which the fluidised bed chemical vapour deposition is intended to be carried out. Thus, the reactive gases can be mixed directly at the reaction temperature in the treatment zone, in order to react directly when they are mixed to form the desired deposit.

This optimum temperature is individual to each pair of first and second reactive gases chosen, and depends, in particular, on the physico-chemical properties of the reactive gases.

For example, in the particular case where a coating of boron nitride (BN) is desired, for example in the case where the first reactive gas is $BCl_3$ and the second reactive gas is $NH_3$ (or vice-versa), the optimum mixing temperature of the gases is the temperature range between 400° C. and 700° C. and preferably the temperature range between 400° C. and 600° C.

For example, when a BN coating is desired, the relative position of the first introduction channel introduction with respect to the heating system can be chosen such that the first channel opens out into a zone for which the temperature is between 400° C. and 700° C., preferably between 400° C. and 600° C.

This temperature makes it possible to avoid the two gases mixing in a zone of the reactor that is too cold, since the two gases could then form undesired salts (called "adducts") which, on the one hand, consume reagents without generating the desired deposit and, on the other hand, can also cause undesirable clogging phenomena.

In an embodiment where a silicon carbide (SiC) coating is desired, in particular when the first and second reactive gases are chosen from methyltrichlorosilane and hydrogen, or when a coating of $Si_3N_4$ is desired, in particular when the first and second reactive gases are chosen from $SiH_4$ and $NH_3$ or $SiH_2Cl_2$ and $NH_3$, the optimum mixing temperature can be greater than or equal to 400° C., or even greater than or equal to 500° C. and less than or equal to the reaction temperature, or even less than or equal to 700° C., or even less than or equal to 600° C.

In this last embodiment, the optimum mixing temperature makes it possible to avoid parasitic reactions which could take place between the reactive gases before the treatment zone.

The optimum mixing temperature is chosen in order to avoid reactions between reagents which could form a solid product which could lead to an undesired deposit in the device or undesired solid particles in suspension in the gaseous phase. The device makes it possible to choose the optimum mixing temperature of the reactive gases in order to avoid them participating in a reaction other than that for producing the coating. It also makes it possible to achieve a maximum coating rate of the particles, even on particles of small dimensions.

The diffuser present in the device can, on the one hand, hold the particles to be coated in the treatment zone and, on the other hand, enable a better homogenisation of the gases which pass through it.

The second introduction channel opens out under the diffuser.

Hence, the second reactive gas passes through the diffuser before entering into the treatment zone. As a result, this last embodiment gives better homogenisation.

In an embodiment, the diffuser is capable of being moved with respect to the heating system. This makes it possible to adjust the temperature in the treatment zone by moving the diffuser away from the heating system, if necessary, or conversely by bringing it closer.

In a first embodiment, the first introduction channel is capable of passing through the diffuser and of opening up into the treatment zone.

In this embodiment, the mixture of two reactive gases takes place directly in the treatment zone, which makes it possible to ensure that no reaction is possible between the reactive gases upstream of the treatment zone and that the reaction between the reactive gases takes place directly in the treatment zone, ensuring a better yield of deposit.

Throughout the application, the terms "upstream" and "downstream" are understood in relation to the flow of reactive gases, the reactive gases flowing from upstream to downstream. A zone will be said to be upstream if it is located under the treatment zone, and a zone will be said to be downstream if it is located above the treatment zone.

In general, it is however not necessary that the mixing between the reactive gases is carried out directly in the treatment zone, provided that the reactive gases are then mixed at an optimum temperature.

In an embodiment, the diffuser is located in a zone for which the temperature corresponds to the optimum mixing temperature, less than the reaction temperature.

For example, the first introduction channel can be capable of opening out under the diffuser or even in the diffuser.

The temperature in the diffuser, or under the diffuser, is a function of its distance from the heating system. It is therefore possible to place the latter so that the optimum temperature is obtained in the diffuser or under it.

In such embodiments, the mixture of the first and second reactive gases passes through all or part of the diffuser before entering the treatment zone. This results in a better homogenisation of the mixture before its introduction into the reactor.

The heating system enables the treatment zone to be at the reaction temperature.

In an embodiment, the reactor can further comprise a thermal insulator.

For example, the thermal insulator can be placed between the diffuser and the treatment zone. When it is present, the thermal insulator is porous.

The presence of the thermal insulator makes it possible to substantially vary the temperature in the reactor while maintaining the diffuser relatively close to the heating system, thus enabling the entire reaction chamber to be of smaller dimension.

In an embodiment where a thermal insulator is present, the latter can be moveable with respect to the heating system following the setting in motion of the diffuser supporting the thermal insulator.

By choosing the nature and position of the thermal insulator, it is possible to obtain a temperature under the thermal insulator that is less than the reaction temperature of the first and second reactive gases, but corresponding to the optimum mixing temperature.

In an embodiment, the particles have a small dimension, in other words a number-average of their largest dimension between 150 μm and 500 μm.

It is observed that particles with these dimensions are particularly suitable for a fluidised bed deposition treatment because they have no tendency to agglomerate together in the form of pellets.

In an embodiment, the first introduction channel of the first reactive gas opens out in the treatment zone.

For example, the first introduction channel capable of being moved with respect to the heating system can be a moveable rod.

In an embodiment, the device further comprises an additional heating system configured to heat a zone downstream of the treatment zone to a temperature greater than or equal to the temperature of the treatment zone.

Such a downstream zone equipped with an additional heating system is not indispensable for obtaining the coating per se, but makes it possible to ensure a complete reaction of the reactive gases, and thus to avoid the formation of soot downstream of the treatment zone.

For example the temperature of such a zone downstream of the treatment zone can be between 1400° C. and 1600° C.

The additional heating system can ensure the decomposition of the reactive gases which have not reacted in the treatment zone, so that their decomposition takes place at a chosen location. It thus makes it possible to avoid the formation of soot which can form in the lines downstream of the treatment zone in the absence of such an additional heating system.

In an embodiment, the device further comprises a supplementary heating system configured to heat a zone upstream of the treatment zone, i.e. a zone under the diffuser. The supplementary heating system makes it possible, for example, to precisely adjust the temperature upstream of the diffuser to an optimum temperature.

According to another of its aspects, the invention further relates to a method for coating particles by fluidised bed chemical vapour deposition, comprising at least:

introducing particles into the treatment zone of a reactor, the particles being made of ceramic material or of carbon;

introducing a first reactive gas into a first channel for introducing gas;

introducing a second reactive gas into a second channel for introducing gas, which second channel is separate from the first channel for introducing gas;

heating the treatment zone to a temperature enabling the reaction of the first and second reactive gases in the treatment zone so as to coat the particles, the first introduction channel opening out in a zone where the temperature is greater than that of the zone where the second channel opens out.

This makes it possible to only mix the two reactive gases at a chosen optimum temperature, and thus avoid the mixing taking place at too low a temperature. In this way, since the reactive gases are not mixed before being heated, undesired reactions which could consume the reactive gases without forming a coating are avoided, and the yield is therefore improved in comparison with the methods of the prior art.

In an embodiment, the first channel can open out in a zone where the temperature is greater by at least 150° C., or even greater by at least 300° C., than the temperature of the zone in which the second channel opens out.

The temperature difference makes it possible to avoid mixing between the first and second reactive gas taking place at too cold a temperature, so that undesired reactions taking place at these temperatures are avoided. For example, in the case where the desired coating is a boron nitride coating, such a temperature difference makes it possible to avoid the formation of adducts.

In an embodiment, the first channel opens out in a zone where the temperature is between 400° C. and 700° C., and preferably between 500° C. and 600° C. This embodiment is particularly preferred in the case where the first reactive gas is $BCl_3$ and the second reactive gas is $NH_3$, or vice-versa.

In another embodiment, the first channel opens out in a zone where the temperature is greater than or equal to 400° C., or even greater than or equal to 500° C. and less than or equal to the reaction temperature, or even less than or equal to 700° C., or even less than or equal to 600° C. This method is particularly preferred in the case where the reactive gases are organometallic.

In an embodiment, the method is implemented in a device such as described above.

In an embodiment, the particles are short fibres having an average length less than or equal to 5 mm.

The length of a fibre is understood as the largest dimension of said fibre. Moreover, the term average length shall mean the number-average length of all of the plurality of short fibres introduced.

In an embodiment, the particles to be coated are disposed on the diffuser. In the case where a thermal insulator is present, the particles can be disposed on the thermal insulator.

Such a method is particularly advantageous with such particles, because it makes it possible to produce a coating directly on the short fibres, and to avoid a cutting step of an already coated longer fibre. A person skilled in the art will choose the first and the second reactive gases from known reactive gases for obtaining the desired coating.

In an embodiment, the first and the second reactive gases are $BCl_3$ and $NH_3$, so as to coat the particles with boron nitride. It is intended that each of $BCl_3$ and $NH_3$ can be either the first or the second reactive gas. The inventors have, more specifically, observed that it is possible to deposit boron nitride on short fibres without causing adducts upstream of the treatment zone, by means of a method as described above and by using these reactive gases.

Within the meaning of the invention, the reaction between the reactive gases is not necessarily a direct reaction between the first and second reactive gases. In an embodiment, the reaction between the two reactive gases can be a reaction between one or more products obtained by thermal decomposition of the reactive gases.

In other embodiments, the first and second reactive gases can be chosen from precursors of silicon carbide, in particular methyltrichlorosilane and hydrogen, or from precursors of $Si_3N_4$, in particular $SiH_4$ and $NH_3$ or $SiH_2Cl_2$ and $NH_3$.

In an embodiment, the position where the first introduction channel of the first reactive gas opens out can vary during the method. For example, in an embodiment, the first channel can be moved closer to or further away from the heating system during the course of the method.

This variation makes it possible, as disclosed above, to finely adjust the nature and crystallinity of the coating layers obtained, because these parameters depend in particular on the temperature, and thus on the position at which the mixing of the reactive gases takes place.

In another embodiment, the position of the diffuser, or where applicable of the thermal insulator, can vary during the course of the method.

This variation makes it possible to precisely adjust the temperature at which the reaction takes place, by moving the treatment zone, delimited by the diffuser or, where applicable by the thermal insulator, with respect to the first heating system. This variation makes it possible to adjust the nature and crystallinity of the coating layers obtained, because these parameters depend on the temperature at which the reaction takes place, and thus on the position of the treatment zone relative to the heating system.

For example, it can be chosen to deposit, at the start of the method, a coating composed of a first phase of boron nitride having a first degree of crystallinity, giving the coating oxidation resistance properties. For the deposition of this first phase, the diffuser supporting the particles to be coated is placed at a distance from the heating system, such that the particles to be coated are at a first temperature. This deposition is followed by the deposition of a coating composed of a second phase of boron nitride having a second degree of crystallinity, greater than the first degree of crystallinity. The second phase is deposited after having moved the diffuser closer to the heating system, in order that the particles to be coated are at a second temperature, greater than the first temperature. The second degree of crystallinity gives the coating crack diversion properties.

In an embodiment, the method comprises an additional heating step, carried out in a zone downstream of the treatment zone where the temperature is higher than in the treatment zone.

The purpose of such a step is to decompose the reactive gases which have not reacted in the treatment zone.

BRIEF DESCRIPTION OF THE DRAWINGS

FIG. 1 schematically shows a device according to a first configuration capable of implementing the invention.

FIG. 2 schematically shows a device according to a second configuration capable of implementing the invention.

FIG. 3 schematically shows a device according to a third configuration capable of implementing the invention.

DESCRIPTION OF THE EMBODIMENTS

The invention will now be described by means of particular embodiments which are detailed for the purpose of understanding the invention, but which should not be interpreted in a limiting manner.

As described above, the invention relates to a device 100 for chemical vapour deposition.

FIG. 1 illustrate such a device 100.

The device 100 comprises a first channel 20 for introducing a first reactive gas 22, which opens out, in the illustrated embodiment, in a thermal insulator 30.

In the embodiment shown, the thermal insulator rests on a diffuser 31 formed by a porous sinter. Such a sinter participates in the homogenisation of the reactive gases which pass through it. In the embodiment proposed in FIG. 1, the first channel 20 can pass through the porous sinter.

For example, the porous sinter 31 can be a platinum-rhodium plate.

The device also comprises a second channel 10 for introducing a second reactive gas 14.

In the embodiment shown, the flow of first 22 and second 14 reactive gases, represented by arrows, takes place respectively in the first 20 and second 10 channels for introducing gases.

For example, the first and second channels for introducing gases 10, 20 can be directly connected to the sources (not shown) of the reactive gases chosen to carry out the reaction. In the illustrated example, the distinct channels for introducing gases 10, 20 enable the mixing of the first and second reactive gases 14, 22 to take place in the insulator 30.

In an embodiment, the thermal insulator 30 can be a porous thermal insulator having a thermal conductivity at 20° C. less than or equal to 4.0 $W \cdot m^{-1} \cdot K^{-1}$, for example less than or equal to 3.0 $W \cdot m^{-1} \cdot K^{-1}$. In an embodiment, the thermal insulator can have a thermal conductivity at 20° C. greater than or equal to 0.1 $W \cdot m^{-1} \cdot K^{-1}$.

In an embodiment, the degree of porosity by volume of the thermal insulator 30 is greater than 26%, for example greater than or equal to 32%.

The thermal insulator 30 can obtain a temperature difference between the treatment zone 40, provided with a heating system 50 and the zone under the thermal insulator.

The diffuser 31 delimits the reactor 12 under the treatment zone 40. In the embodiment shown, a thermal insulator 30 is also present. However, the device 100 can further comprise other thermal insulators such as those conventionally usually used outside, around or in the walls of a chemical deposition furnace.

In an embodiment, the thermal insulator is a granular bed.

Such a feature advantageously contributes to yet further reducing the effective thermal conductivity of the thermal insulator 30, yet further stabilising the temperature of the fluidised bed during the deposition of the coating. In the particular case of a granular bed, such porosity values correspond to a "bulk" state, in other words an irregular or non-compact state.

It is possible, for example, to use a granular bed formed of bulk grains having an average diameter d50 less than or equal to 10 mm, for example between 0.5 μm and 10 mm, and a density greater than or equal to 3 $g/cm^3$, for example between 3.2 $g/cm^3$ and 9 $g/cm^3$. For example, a bulk stack of zirconia beads can be used, having an average diameter d50 equal to 1 mm in order to constitute the thermal insulator 30.

In an embodiment, the wall of the device 100 can be made of mullite or treated alumina.

In an embodiment, the reactive gases can be $BCl_3$ and $NH_3$, the decomposition of which at the temperature of the treatment zone 40 makes it possible to obtain reactive compounds, the reaction of which makes it possible to deposit a coating of BN directly on the carbon or ceramic particles 80 introduced into the treatment zone 40, for example on the diffuser 31.

For example, the flow of the first 22 and second reactive gas 14 can be obtained by imposing a pressure difference between the ends of the device 100, by means of devices that are known per se, for example pumps, and not shown in FIG. 1.

In an embodiment, the flow of first 22 and/or second reactive gas 14 can further comprise an inert carrier gas, for example molecular nitrogen. Gaseous precursors can be used under standard conditions, in which case they can be mixed with the carrier gas before their introduction into the device 100.

For example, the flow rate for introduction of the carrier gas into a reactor 12, as shown schematically in FIG. 1, can be between 500 standard cubic centimetres per minute and 4000 standard cubic centimetres per minute, for example between 1000 standard cubic centimetres per minute and 2000 standard cubic centimetres per minute.

The first introduction channel 20 is a movable rod, the vertical position of which can be adjusted. The device thus comprises a movement system which enables the first introduction channel 20, and optionally the diffuser 31, to move with respect to the heating system 50.

In the embodiment shown, the diffuser 31 is porous and delimits the lower part of the reactor 12, into which particles 80 are introduced.

In the embodiment shown, the particles 80 are short fibres.

In the device for fluidised bed chemical vapour deposition, the reactive gases introduced, and the decomposition of which makes it possible to obtain the coating on the particles 80 present in the treatment zone 40, also make it possible to obtain a dispersion of particles 80 which contributes to obtaining a homogeneous coating.

In FIGS. 2 and 3, the elements bear the same numbers representing elements analogous to those of FIG. 1.

FIG. 2 shows a configuration in which the first channel 20 for introducing a first reactive gas 22 opens out into the treatment zone 40 enabling mixing of the first 22 and second reactive gas 14 directly in the treatment zone.

FIG. 3 shows a configuration in which the first channel 20 for introducing a first reactive gas 22 opens out under the diffuser 31, for example at a short distance 23 from the diffuser 31, for example less than or equal to 2 mm. It is understood that this distance 23 is measured in the direction of gas flow between the upper end of the first introduction channel 20 and the diffuser 31.

In any one of the embodiments described above, it is also possible to introduce, into the treatment zone 40, spacer particles, distinct from the particles to be coated, in order to again further improve the homogeneity of the coating obtained.

Such particles can, for example, be made of ceramic material (oxide or non-oxide), such as alumina, silicon carbide or silicon nitride. Alternatively, the spacer particles can be metallic.

The average diameter of the spacer particles is between 100 μm and 500 μm.

The spacer particles are only present to promote the distribution of gases and particles to be covered in the fluidised bed.

The content of spacer particles by volume in the mixture with the particles to be coated can be between 70% and 95%.

When such spacer particles are present, coated particles are obtained in a more unitary and homogeneous manner.

The treatment zone 40, situated under the diffuser 31, can be heated by means of a heating system 50 that is known per se.

In the configurations shown in FIGS. 1, 2 and 3, the treatment zone 40 is followed, in the direction of gas flow, by a zone situated downstream 70, the temperature of which can be further increased by means of an additional heating system 60, that is also known per se, and separate from the first heating system 50. As described above, such a zone 70 can ensure, due to a temperature that is still higher than that of the treatment zone 40, decomposition of the reactive gases which have not reacted in the treatment zone 40.

The device can be used for the deposition of a ceramic material on the particles 80, for example boron nitride, silicon carbide or silicon nitride.

The invention claimed is:

1. A method for coating particles by fluidised bed chemical vapour deposition, comprising:

introducing particles into the treatment zone of a reactor, the particles being made of ceramic material or of carbon;

introducing a first reactive gas into a first channel for introducing gas;

introducing a second reactive gas into a second channel for introducing gas, which second channel is separate from the first channel for introducing gas; and heating, with a heating system, the treatment zone to a temperature enabling the reaction of the first and second reactive gases in the treatment zone so as to coat the particles, the first introduction channel opening out into a zone where the temperature is greater than that of the zone where the second channel opens out, wherein the first introduction channel is movable with respect to the heating system, and/or wherein the method further comprises moving the first introduction channel with respect to the heating system before introducing the first reactive gas and/or varying a position of the first introduction channel with respect to the heating system during the course of the coating method.

2. The coating method according to claim 1, wherein the particles are short fibres having an average length less than or equal to 5 mm.

3. The coating method according to claim 1, wherein the first and second reactive gases are $BCl_3$ and $NH_3$, so as to coat the particles with boron nitride.

4. The coating method according to claim 1, further comprising an additional heating step, carried out in a zone downstream of the treatment zone where the temperature is higher than in the treatment zone.

* * * * *